United States Patent
Lin

[19]

[11] Patent Number: 6,093,969
[45] Date of Patent: Jul. 25, 2000

[54] FACE-TO-FACE (FTF) STACKED ASSEMBLY OF SUBSTRATE-ON-BARE-CHIP (SOBC) MODULES

[76] Inventor: Paul T. Lin, 673 Hillcrest Ter., Fremont, Calif. 94539

[21] Appl. No.: 09/313,562

[22] Filed: May 15, 1999

[51] Int. Cl.[7] .................................................. H01L 23/495
[52] U.S. Cl. ............................................ 257/777; 257/778
[58] Field of Search ..................................... 257/777, 778, 257/724, 738; 438/108, 109, 686

[56] References Cited

U.S. PATENT DOCUMENTS

| | | | |
|---|---|---|---|
| 5,726,493 | 3/1998 | Yamashita et al. | 257/777 |
| 6,020,629 | 2/2000 | Farnworth et al. | 257/777 |

*Primary Examiner*—David Hardy
*Assistant Examiner*—Lourdes Cruz
*Attorney, Agent, or Firm*—Bo-In Lin

[57] ABSTRACT

The present invention discloses a face-to-face (FTF) stacked integrated circuit (IC) assembly. The FTF stacked IC assembly includes a first and a second substrate-on-bare-chip (SOBC) modules. Each of the first and second SOBC modules includes a printed circuit board (PCB) having a PCB bottom surface overlying an active circuit surface of a bare integrated circuit (IC) chip. The PCB includes a window opened substantially in a central portion of the active circuit surface of the bare IC chip. The bare IC chip includes bare-chip bonding-pads disposed on the active circuit surface in the window and the PCB includes a plurality of PCB bonding pads. Each of the first and second SOBC modules includes a plurality of bonding wires interconnecting the bare-chip bonding pads to the PCB bonding pads. Each of the first and second SOBC modules includes a plurality of solder balls disposed on a PCB top surface of the PCB connected to the PCB bonding pads with a plurality of metal traces disposed on the PCB board. The solder balls of first SOBC module mounted on the solder balls of the second SOBC module constituting a face-to-face (FTF) stacked SOBC assembly.

10 Claims, 4 Drawing Sheets

FACE-TO-FACE (FTF) STACKED ASSEMBLY OF SUBSTRATE-ON-BARE-CHIP (SOBC) MODULES

BACKGROUND OF THE INVENTION

1. Field of the Invention

This invention relates generally to the electronic package. More particularly, this invention relates to a novel packaging configuration with face-to-face-stacked substrate-on-chip module to increase the packing density of electronic devices specially the integrated circuit (IC) memory devices.

2. Description of the Prior Art

There are constant challenges faced by the electronic packaging industry to first increase the packing density. Meanwhile, as the performance level of the integrated circuit is improved, another desired packaging feature is to improve the speed of signal transmission. On the one hand, the extra transmission paths caused by the additional structures imposed by the package often slow the speed of signal transmission down. Additionally, the packaging materials may also generate parasitic capacitance and inductance that will also cause noise and the slowing down of speed of signal transmission. Conventional packaging configurations typically employed with multiple layer of structures as will be illustrated and discussed below are not able to resolve these difficulties.

In U.S. Pat. No. 5,222,014, entitled "Three Dimensional Multi-chip Pad Array Carrier" (issued on Jun. 22, 1993), Lin disclosed a stackable three dimensional multiple chip module. Each level of the chip carrier is interconnected to another level of chip carrier through reflowing of the solder balls. The chip carriers are provided with solder balls on the top and the bottom surfaces of the substrates. FIG. 1A shows the stackable multiple-chip structure. In this packaging structure, the chips are not bare chips but chips that are first packaged by using a first level substrate. are not bare chips but chips that are first packaged by using a first level substrate. Then the packaged chips are mounted on the stackable chip carriers to form a stacking module. Even that improvements are achieved by using a flexibly stackable chip carrier, further improvements of packing density and the signal transmission speed are limited in this kind of pad array carrier stacking configuration. The limitation is inherent because the stacked chips are first packaged in a wire-bonding configuration where all signal paths, i.e., the bonding wires, are routed to bonding pads outside of the die area before stacking. The tacked chip carrier then provides metal traces for transmitting signals between the stacked chips. The speed of the signal transmission is slowed down due to the requirement that the signals have to travel through a longer transmission paths through the bonding wires routed outside of the die area before stacking.

Another prior art structure is shown in FIG. 1B where multiple substrate on chip (SOC) packages are stacked up to increase the packing density. The SOC packages are formed on a lead frame structure. The leads allow for contact on both the top and the bottom surface of the package. The lead framed SOC as shown in FIG. 1B is stacked up as three-dimensional packaging module. The configuration is applied to high density mounting for memory of personal computer (PC) cards. Compared to regular non-stacking configuration, the stacked package as shown in FIG. 2 has a smaller mounting area and occupies less volume. However, the lead frame structure causes the signal to transmitter longer paths from one chip to another chip. Furthermore, a multiple-level configuration commonly implemented in the prior art packaging technology such as this additional layer of lead frame structure imposes additional complexity and limitations. Since all leads from the lead frame are routed to outside of the packaged body along the perimeters, it imposes a limitation on the minimum body size for a given lead pitch. Furthermore, the additional processing steps of lead wrapping and lead stacking will impact the cost and yield of manufacturing.

Therefore, a need still exits in the art to provide an improved configuration and procedure for increasing the packing density and to prevent signal transmission delays caused by structures added by the packaging structures.

SUMMARY OF THE PRESENT INVENTION

It is therefore an object of the present invention to provide an improved packaging configuration to increase the packing density without causing delays of the signal transmission. An improved substrate on bare chip (SOBC) basic structure is implemented to configure a face to face stacking assembly. Direct contact of solder balls is implemented to form the stacking configuration. Improvement of signal transmissions is achieved between two stacked integrated circuit (IC). chips. The improved chip module is provided to overcome the aforementioned difficulties and limitations encountered in the prior art.

Specifically, it is an object of the present invention to provide an improved substrate on bare chip (SOBC) chip module by applying a surface mounting assembly technology. In the improved chip module, a bare chip is attached via an adhesive layer to the backside of a laminated board provided with a bonding wire opening and bonding pads on the top surface. The bare chip is then wire bonded to the board with bonding wires pass through the bonding wire opening. The chip module, i.e., a substrate on bare chip (SOBC) module, is further configured as a chip-size package (CSP) ready assembly with via connectors penetrating the laminating board interconnecting the bonding pads to an array of solder balls as a CSP. These SOBC CSP can then be conveniently stacked up by mounting a top CSP to a bottom CSP with the solder balls in physical contact and soldered together as a face-to-face stacked module.

Another object of the present invention is to provide an improved face-to-face stacked chip module increasing the packing density and also improve the signal transmission speed because the solder balls of two SOBC CSP modules are in direct physical contact and the signal transmission delays are greatly reduced.

Another object of the present invention is to provide an improved face-to-face stacked chip module for increasing the packing density and also reduce the stacking height. This is achieved because the solder balls of two SOBC CSP modules are in direct physical contact melted during a soldering process and the stacking height of the packaged assembly is reduced.

Another object of the present invention is to provide an improved face-to-face stacked chip module for reducing the potential damages of the integrated circuit (IC) chips from radiation particles. This is achieved because the face-to-face configuration where the active surfaces of the IC chips formed with active device circuits are shielded.

Briefly, in a preferred embodiment, the present invention includes a face-to-face (FTF) stacked integrated circuit (IC) assembly. The FTF stacked IC assembly includes a first and a second substrate-on-bare-chip (SOBC) modules. Each of the first and second SOBC modules includes a printed circuit board (PCB) having a PCB bottom surface overlying an active circuit surface of a bare integrated circuit (IC) chip. The PCB includes a window opened substantially in a central portion of the active circuit surface of the bare IC chip. The bare IC chip includes bare-chip bonding-pads disposed on the active circuit surface in the window and the PCB includes a plurality of PCB bonding pads. Each of the first and second SOBC modules includes a plurality of bonding wires interconnecting the bare-chip bonding pads to the PCB bonding pads. Each of the first and second SOBC modules includes a plurality of solder balls disposed on a PCB top surface of the PCB connected to the PCB bonding pads with a plurality of metal traces disposed on the PCB board. The solder balls of first SOBC module mounted on the solder balls of the second SOBC module constituting a face-to-face (FTF) stacked SOBC assembly. In a preferred embodiment, each of the first and second SOBC modules further includes an adhesive layer attaching the bare IC chip to the PCB bottom surface. In another preferred embodiment, the PCB of the first and second SOBC modules is a laminated multiple-layered PCB includes through-hole connectors and via-connectors interconnecting the metal traces in several layers of the PCB and the solder balls. In another preferred embodiment, the PCB of the first and second SOBC modules further includes a bonding-pad platform disposed next to the window for disposing the PCB bonding pads thereon. In another preferred embodiment, the PCB of the first and second SOBC modules further includes passive components connected to the metal traces on the PCB. In another preferred embodiment, the window of the first and second SOBC modules constituting a two-step window. The window has a top-wide window and bottom-narrow window and the PCB further includes a bonding-pad platform disposed on a step-surface interfacing between the top-wide window and the bottom-narrow window for disposing the PCB bonding pads thereon.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
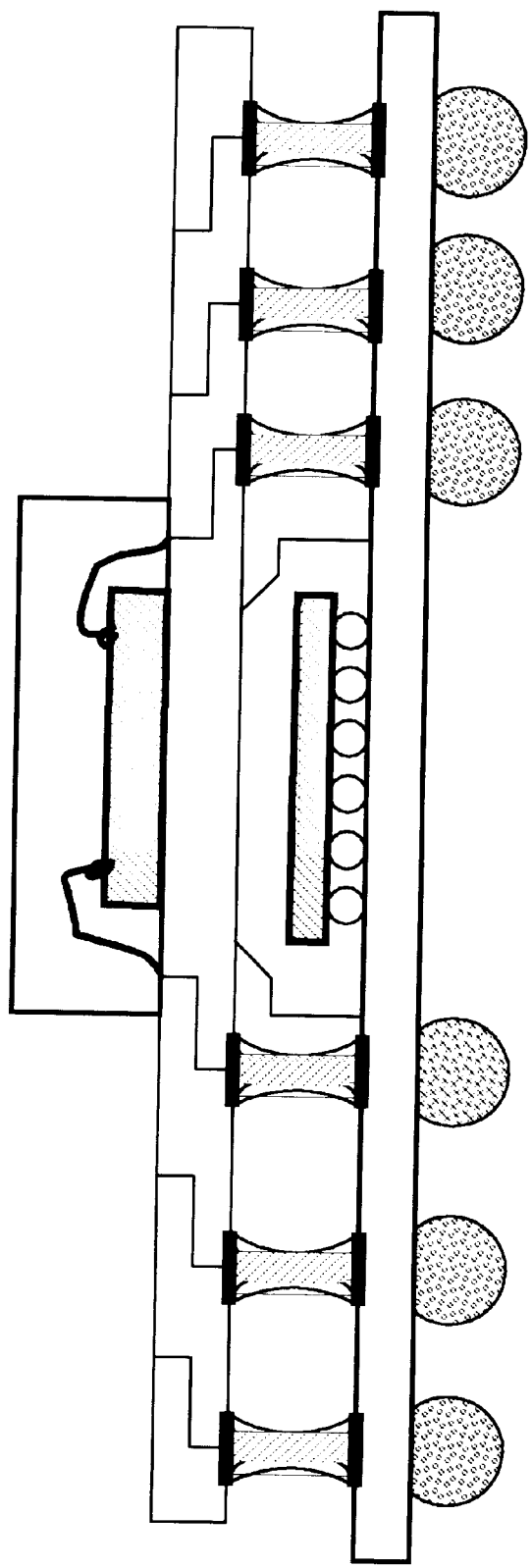
FIGS. 1A and 1B are cross sectional views two alternate stacked chip modules disclosed in two prior art references where the packaged IC chips are mounted on stacked chip carriers for increasing the packing density.
Figure 1B:
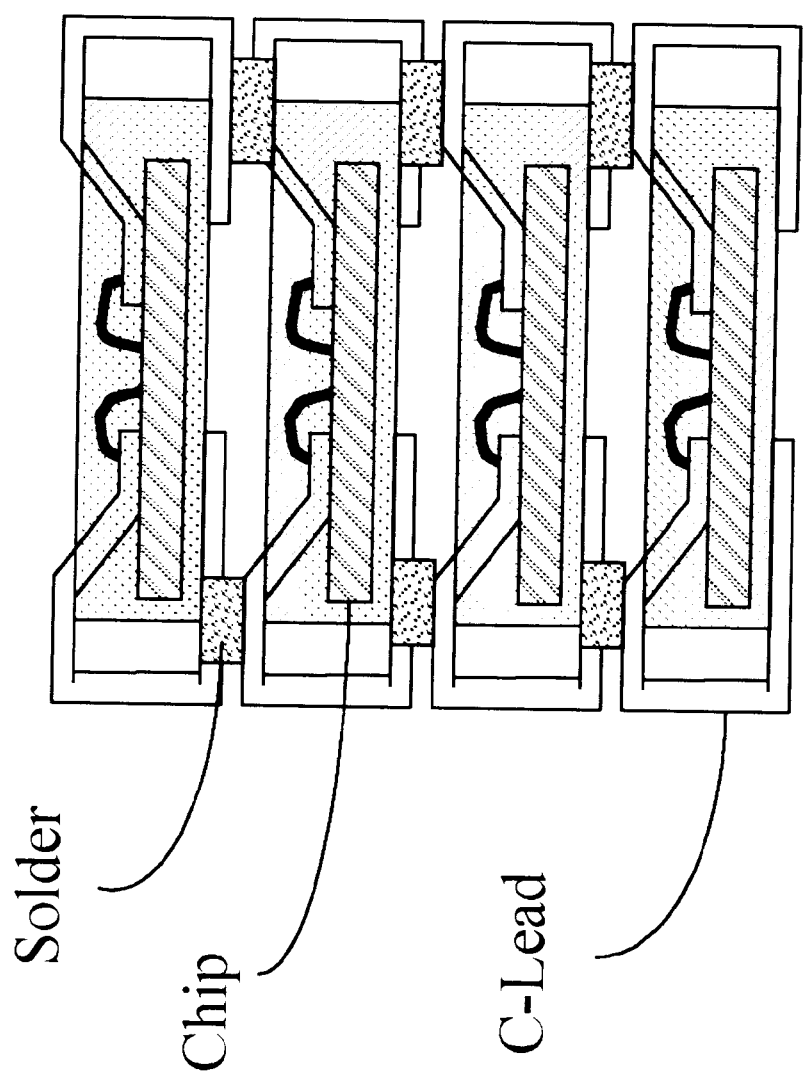
Figure 2:
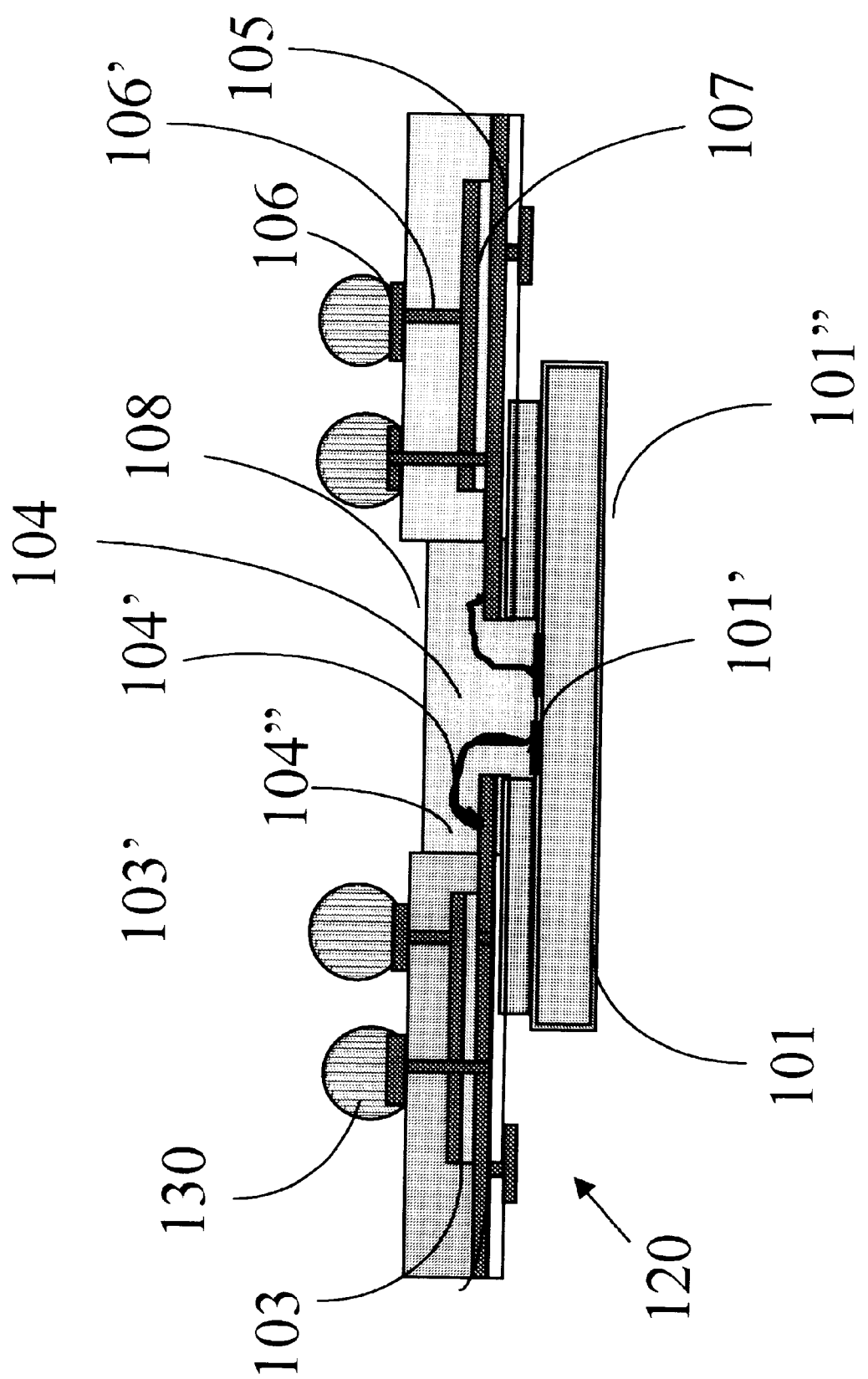
FIG. 2 is a cross sectional view of a substrate on bare chip (SOBC) module of a pending application invention by one Applicant of this invention and this SOBC module is employed in this invention to form the face-to-face stack module with double packing density.

Please refer to FIG. 2 for a cross sectional view of a substrate-on-bare-chip (SOBC) memory module 120 of a pending Patent Application filed by Paul Lin as one of the Applicants of this invention. The SOBC memory module 120 includes a bare integrated circuit (IC) chip 101, e.g., a memory chip with a central pads layout having the bonding pads placed near the center-portion of the chip. The bare memory chip 101 is attached to a laminated printed circuit board 103 via an adhesive layer 102. The laminated PCB 103 has a bonding-wire window 104 opened at the bottom layers provided for allowing a plurality of bonding wires 104' to pass through for interconnecting the bonding pads 101' on the memory chip 101 to corresponding bonding pads 103'. The multiple-layer laminated PCB 103 further includes a cavity 104" opened from the top layers of the PCB 103 on top of the bonding wire window 104. The cavity 104" is opened with slightly greater area than the bonding wire window 104 thus exposed the top surface of the bottom layers. The bonding pads 103' are placed on the exposed top surface of the bottom layers of the laminated PCB 103 exposed by the cavity 104". A plurality of metal traces 105 interconnect the substrate bonding pads 103' to a corresponding through-hole connector 106 penetrating through the laminated PCB 103 or a via connector 106' penetrating through some layers of the PCB 103. Each of the through-hole and via connectors 106 or 106' is then connected to a corresponding solder ball 130. The multiple-layered laminated PCB 103 further includes built-in passive components 107 such as capacitors, resistors, or inductors depending on various requirements of specific circuit design. The cavity 104" and the bonding wire window 104 opened for wire bonding connections between the IC chip 101 and the circuit elements on the substrate 103 is then encapsulated. An encapsulation layer 108 is employed to seal and protect the IC chip 101 and the bonding-wires 104'. The SOBC module 120 has a special advantage that the backside 101" of the IC chip 101 is totally exposed for direct heat dissipation. The thermal performance of the IC chip and the package is significantly improved.

Figure 3:
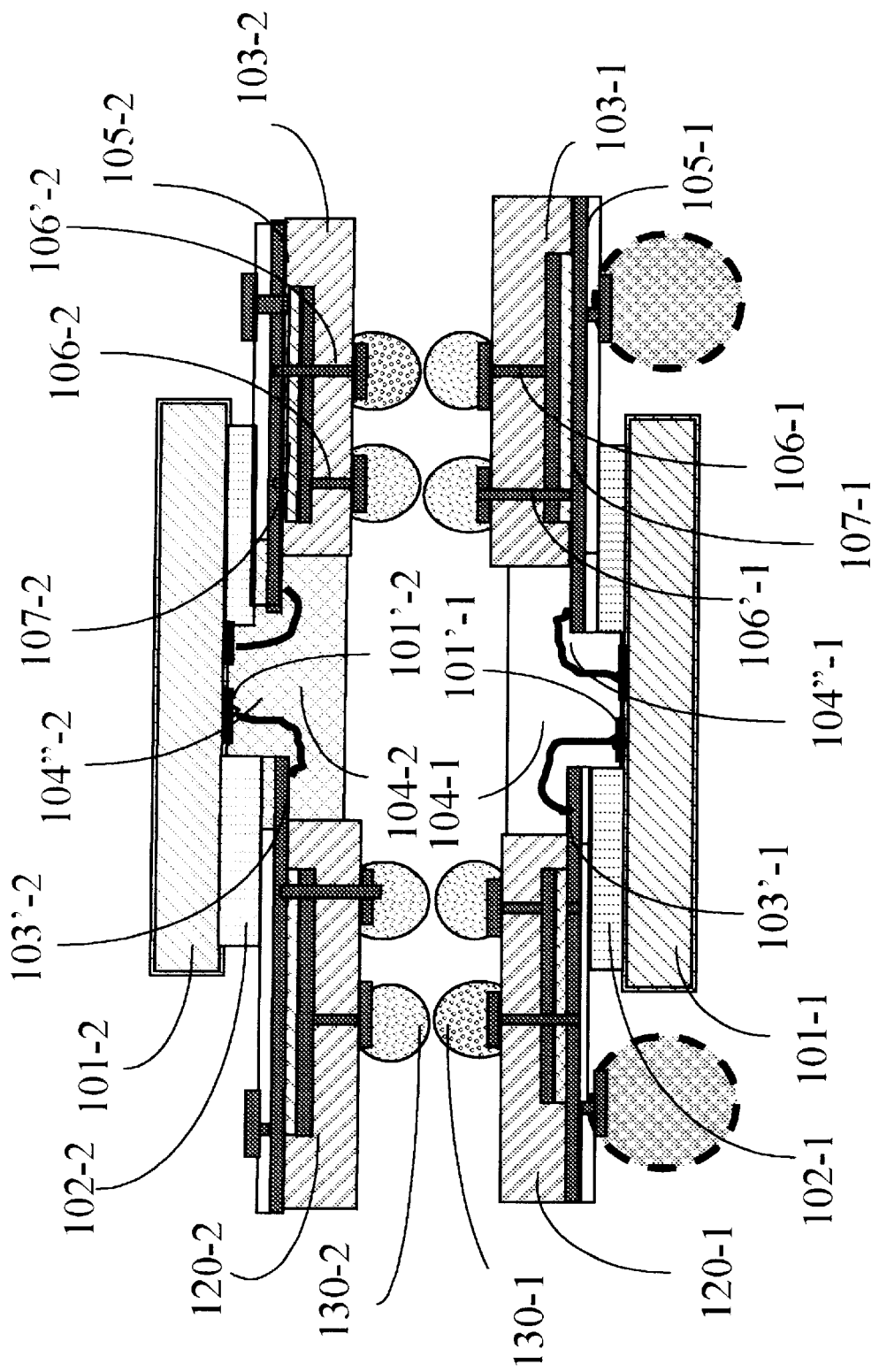
FIG. 3 is a cross sectional view of a face to face stacked module with double packing density and high signal transmission speed implemented with substrate on bare chip (SOBC) module of FIG. 2.

FIG. 3 is high-density module by implementing a face-to-face (FTF) stacked substrate-on-bare-chip (SSOBC) module configuration of this invention. For the purpose of increasing the packing density of the integrated circuit (IC) chips, a face-to-face configuration is implemented by stacking two identical substrate-on-chip modules 120-1 and 120-2 of FIG. 2 with a face to face configuration. The solder balls 130-1 of the top SOBC module 120-1 is mounted on a corresponding solder ball 130-2 of the bottom SOBC module 120-2. The packing density is doubled when two substrate-on-chip modules 120-1 and 120-2 are stacked in a face to face configuration. The speed of signal transmission is improved because the path for signal transmission between the chips 120-1 and 120-2 is shortened with the solder balls soldered together.

According to FIG. 3 and above description, this invention discloses a face-to-face (FTF) stacked integrated circuit (IC) assembly. The FTF stacked IC assembly includes a first and a second substrate-on-bare-chip (SOBC) modules 120-1 and 120-2. Each of the first and second SOBC modules includes a printed circuit board (PCB) 103-1 and 103-2 having a PCB bottom surface overlying an active circuit surface of a bare integrated circuit (IC) chip 101-1 and 101-2. The PCB includes a window 104-1 and 104-2 opened substantially in a central portion of the active circuit surface of the bare IC chip. The windows 104-1 and 104-2 can be simple window openings instead of two step windows. The bare IC chip includes bare-chip bonding-pads 101'-1 and 101'-2 disposed on the active circuit surface in the window and the PCB includes a plurality of PCB bonding pads 103'-1 and 103'-2. Each of the first and second SOBC modules includes a plurality of bonding wires 104'-1 and 104'-2 interconnecting the bare-chip bonding pads 101'-1 and 101'-2to the PCB bonding pads 103'-1 and 103'-2. Each of the first and second SOBC modules includes a plurality of solder balls 130-1 and 130-2 disposed on a PCB top surface of the PCB connected to the PCB bonding pads with a plurality of metal traces 105-1 and 105-2 disposed on the PCB board 103-1 and 103-2. The solder balls 130-1 of first SOBC module mounted on the solder balls 130-2 of the second SOBC module constituting a face-to-face (FTF) stacked SOBC assembly. In a preferred embodiment, each of the first and second SOBC modules further includes an adhesive layer 102-1 and 102-2 attaching the bare IC chip to the PCB bottom surface. In another preferred embodiment, the PCB of the first and second SOBC modules is a laminated multiple-layered PCB includes through-hole connectors 106-1 and 106-2 and via-connectors 106'-1 and 106'-2 interconnecting the metal traces 105-1 and 105-2 in several layers of the PCB and the solder balls. In another preferred embodiment, the window opened in the PCB of the first and second SOBC modules is a cavity window which further includes a bonding-pad platform disposed next to the cavity window for disposing the PCB bonding pads thereon. In another preferred embodiment, the PCB of the first and second SOBC modules further includes passive components 107-1 and 107-2 connected to the metal traces 105-1 and 105-2 on the PCB. In another preferred embodiment, the cavity window 104"-1 and 104"-2 of the first and second SOBC modules constitute a two-step window. The window has a top-wide window and bottom-narrow window and the PCB further includes a bonding-pad platform disposed on a step-surface interfacing between the top-wide window and the bottom-narrow window for disposing the PCB bonding pads 103'-1 and 103'-2 thereon.

Therefore, the present invention provides an improved packaging configuration to increase the packing density without causing delays of the signal transmission. An improved substrate on bare chip (SOBC) basic structure is implemented to configure a face to face stacking assembly. Direct contact of solder balls is implemented to form the stacking configuration. Improvement of signal transmissions is achieved between two stacked integrated circuit (IC) chips and the difficulties and limitations encountered in the prior art are resolved. Specifically, an improved substrate on bare chip (SOBC) chip module is disclosed by applying a surface mounting assembly technology. In the improved chip module, a bare chip is attached via an adhesive layer to the backside of a laminated board provided with a bonding wire opening and bonding pads on the top surface. The bare chip is then wire bonded to the board with bonding wires pass through the bonding wire opening. The chip module, i.e., a substrate on bare chip (SOBC) module, is further configured as a chip-size package (CSP) ready assembly with micro or blind via connectors penetrating the laminating board interconnecting the bonding pads to an array of solder balls as a CSP. These SOBC CSP can then be conveniently stacked up by mounting a top CSP to a bottom CSP with the some of solder balls directly under die area in physical contact and soldered together as a face-to-face stacked module. With this improved face-to-face stacked chip module, the packing density, thermal path and the signal transmission speed are improved because the solder balls of two SOBC CSP modules are in direct physical contact and the signal transmission delays are greatly reduced. In addition to the increase in packing density, the stacking height is decreased. This is achieved because the solder balls of two SOBC CSP modules are in direct physical contact melted and self aligned during a soldering process and the stacking height of the packaged assembly is reduced. Furthermore, the potential damages to the integrated circuit (IC) chips from radiation particles are reduced. This is achieved because in the face-to-face configuration, both the top and bottom surfaces of PCB shield the active surfaces of the IC chips.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A face-to-face (FTF) stacked integrated circuit (IC) assembly comprising:

a first and a second substrate-on-bare-chip (SOBC) modules;

each of said first and second SOBC modules includes a printed circuit board (PCB) having a PCB bottom surface overlying an active circuit surface of a bare integrated circuit (IC) chip;

said PCB includes a window opened substantially in a central portion of said active circuit surface of said bare IC chip;

said bare IC chip includes bare-chip bonding-pads disposed on said active circuit surface in said window and said PCB includes a plurality of PCB bonding pads;

each of said first and second SOBC modules includes a plurality of bonding wires interconnecting said bare-chip bonding pads to said PCB bonding pads; and each of said first and second SOBC modules includes a plurality of solder balls disposed on a PCB top surface of said PCB connected to said PCB bonding pads with a plurality of metal traces disposed on said PCB board; and said solder balls of first SOBC module mounted on said solder balls of said second SOBC module constituting a face-to-face (FTF) stacked SOBC assembly.

2. The FTF stacked IC assembly of claim 1 wherein:

each of said first and second SOBC modules further includes an adhesive layer attaching said bare IC chip to said PCB bottom surface.

3. The FTF stacked IC assembly of claim 1 wherein:

said PCB of said first and second SOBC modules is a laminated multiple-layered PCB includes through-hole connectors and via-connectors interconnecting said metal traces in several layers of said PCB and said solder balls.

4. The FTF stacked IC assembly of claim 1 wherein:

said window of said PCB of said first and second SOBC modules is a cavity window and said cavity window further includes a bonding-pad platform disposed next to said cavity window for disposing said PCB bonding pads thereon.

5. The FTF stacked IC assembly of claim 1 wherein:

said PCB of said first and second SOBC modules further includes passive components connected to said metal traces on said PCB.

6. The FTF stacked IC assembly of claim 4 wherein:

said cavity window of said first and second SOBC modules constituting a two-step window having a top-wide window and bottom-narrow window and said PCB further includes a bonding-pad platform disposed on a step-surface interfacing between said top-wide window and said bottom-narrow window for disposing said PCB bonding pads thereon.

7. The FTF stacked IC assembly of claim 1 wherein:

said first and second SOBC modules further includes an encapsulation layer encapsulating said window.

8. A face-to-face (FTF) stacked integrated circuit (IC) assembly comprising:
- a first and a second substrate-on-bare-chip (SOBC) modules each includes a laminated multiple-layered printed circuit board (PCB) having a PCB bottom surface overlying an active circuit surface of a bare integrated circuit (IC) chip;
- each of said first and second SOBC modules further includes an adhesive layer attaching said bare IC chip to said PCB bottom surface;
- said PCB includes a two-step cavity window opened substantially in a central portion of said active circuit surface of said bare IC chip, said cavity window having a top-wide window and bottom-narrow window and said PCB further includes a bonding-pad platform disposed on a step-surface interfacing between said top-wide window and said bottom-narrow window for disposing a plurality PCB bonding pads thereon;
- said bare IC chip includes bare-chip bonding-pads disposed on said active circuit surface in said cavity window;
- each of said first and second SOBC modules includes a plurality of bonding wires interconnecting said bare-chip bonding pads to said PCB bonding pads;
- each of said first and second SOBC modules includes a plurality of solder balls disposed on a PCB top surface of said PCB connected to said PCB bonding pads with a plurality of metal traces disposed on said PCB board wherein said laminated multiple-layered PCB further includes through-hole connectors and via-connectors interconnecting said metal traces in several layers of said PCB and said solder balls; and
- said solder balls of first SOBC module mounted on said solder balls of said second SOBC module constituting a face-to-face (FTF) stacked SOBC assembly.

9. The FTF stacked IC assembly of claim 8 wherein:
said PCB of said first and second SOBC modules further includes passive components connected to said metal traces on said PCB.

10. The FTF stacked IC assembly of claim 8 wherein:
said first and second SOBC modules further includes an encapsulation layer encapsulating said cavity window.

* * * * *